(12) United States Patent
Raub et al.

(10) Patent No.: US 8,685,628 B2
(45) Date of Patent: Apr. 1, 2014

(54) LARGE AREA PATTERNING USING INTERFEROMETRIC LITHOGRAPHY

(75) Inventors: Alexander Raub, Danbury, CT (US); Andrew Frauenglass, Albuquerque, NM (US); Steven R. J. Brueck, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 994 days.

(21) Appl. No.: 11/739,472

(22) Filed: Apr. 24, 2007

(65) Prior Publication Data
US 2007/0274633 A1 Nov. 29, 2007

Related U.S. Application Data

(60) Provisional application No. 60/794,134, filed on Apr. 24, 2006.

(51) Int. Cl.
*G03H 1/26* (2006.01)

(52) U.S. Cl.
USPC ............. 430/321; 430/320; 359/27; 359/35

(58) Field of Classification Search
None
See application file for complete search history.

(56) References Cited

U.S. PATENT DOCUMENTS

| | | | | |
|---|---|---|---|---|
| 4,988,151 A * | 1/1991 | Moss | | 359/9 |
| 5,759,744 A * | 6/1998 | Brueck et al. | | 430/312 |
| 6,307,679 B1 * | 10/2001 | Kashyap | | 359/569 |
| 6,384,977 B1 * | 5/2002 | Laming et al. | | 359/570 |
| 6,463,119 B1 * | 10/2002 | Terashima et al. | | 378/34 |
| 6,548,225 B1 * | 4/2003 | Hammon et al. | | 430/321 |
| 6,574,395 B1 * | 6/2003 | Mechin et al. | | 385/37 |
| 6,707,956 B1 * | 3/2004 | Kim et al. | | 385/10 |
| 6,882,477 B1 * | 4/2005 | Schattenburg et al. | | 359/577 |
| 7,095,504 B1 * | 8/2006 | Ames et al. | | 356/498 |
| 7,459,241 B2 * | 12/2008 | Wago | | 430/1 |
| 7,561,252 B2 * | 7/2009 | Sewell et al. | | 355/67 |
| 2001/0043774 A1 * | 11/2001 | Tormen | | 385/37 |
| 2005/0057735 A1 * | 3/2005 | Smith | | 355/55 |
| 2005/0122593 A1 * | 6/2005 | Johnson | | 359/650 |
| 2006/0109532 A1 * | 5/2006 | Savas et al. | | 359/10 |
| 2006/0127024 A1 * | 6/2006 | Smith et al. | | 385/132 |
| 2006/0170896 A1 * | 8/2006 | Markoya et al. | | 355/67 |
| 2007/0023692 A1 * | 2/2007 | Stenger | | 250/492.2 |

FOREIGN PATENT DOCUMENTS

JP 58-094149 * 6/1983

OTHER PUBLICATIONS

Shattenberg et al. "Progress toward a general grating patterning technology using phase locked scanning beams mage metrology and system controls for scanning beams interferences lithography", Proc. SPIE 4485 pp. 378-384 (2002).*

Gamet et al. "Flying phase mask for the printing of long submicron period stitchless gratings", Microelec. Eng., vol. 83 pp. 734-737 (on line Jan. 2006).*

(Continued)

*Primary Examiner* — Martin Angebranndt

(57) ABSTRACT

Exemplary embodiments provide methods for patterning large areas, beyond those accessible with the limited single-area exposure techniques, with nanometer scale features. The methods can include forming a grating pattern to make a first interferometric exposure of a first portion of a photosensitive material disposed over a substrate by interfering two or more laser beams, wherein the two or more laser beams comprise an apodized intensity profile having a continuous intensity variation. The method can further include aligning and overlapping the grating pattern to expose a second portion of the photosensitive material such that the first portion and the second portion form a continuous grating pattern.

8 Claims, 8 Drawing Sheets

(56) References Cited

OTHER PUBLICATIONS

Sohail et al. "Diffractive techniques for lithographic process monitoring and control", J. Vac. Sci. B., vol. 12(6) pp. 3600-3606 (Nov. 1994).*

Chen et al. "MNanometer-accurate grating fabrication with scanning beams interference ligthography", Proc. SPIE vol. 4936 pp. 126-134 (Nov. 2002).*

Chen et al., Image metrology and systems controls for scanning bean interteference lithography, J. Vac. Sci. B., vol. 19(6) pp. 2335-2341 (Nov. 2001).*

Zaidi et al. "Moire interferometric alignment and overlay techniques", Proc. SPIE 2196 pp. 371-382 (1994).*

Savas et al., "Large are achromatic interferometric lithography for 100nm period gratings and grids", J. Vac. Sci. Technol. B, vol. 14(6) pp. 4167-4170 (Nov.-Dec. 1996).*

Charley et al., "Hyper high numerical aperture achromatic interferometer for immersion lithography as 193 nm", J. Vac. Sci. Technol. B., vol. 23(6) pp. 2668-2674 (Dec. 2005).*

Robertson et al. "Comparison of immersion lithography from projection and interferometric exposure tools", Proc. SPIE vol. 6154, pp. 61544N-1 to 61544N-9 (presented Feb. 19, 2006, published Mar. 22, 2006).*

Translation of JP 58-094149.*

Bourov et al., "Immersion microlithography at 193 nm with a Talbot prism interferometer", Proc. SPIE 5377 pp. 1573-1578 (May 2004).*

"Webb, et al., Immersion lithography micro-objectives", Proc SPIE 5377 pp. 788-797 (2004).*

Cropanese et al., "Synthetic defocus for interferometric lithography", Proc. SPIE 5754 pp. 1769-1779 (2005).*

Farley et al., "Excimer laser irradiated phase masks for grating formation", Proc SPIE vol. 2992 pp. 144-149 (1997).*

Smith et al., "Water immersion optical lithography at 193 nm", J. Microlith., Microfab., Microsyst., vol. 3(1) pp. 44-51 (Jan. 2004).*

Smith et al. "Evanescent wave imaging in optical lithography", Proc SPIE pp. 61540A-1 to 61540A-9 (Mar. 2006).*

Brueck, "Optical and Interferometric Lithography—Nanotechnology Enablers", Proc. IEEE 93, 1704 (2005).

Raub, et al., "Deep-UV Immersion Interferometric Lithography", Proc. SPIE 5377, 306-318 (2004).

* cited by examiner

LARGE AREA PATTERNING USING INTERFEROMETRIC LITHOGRAPHY

RELATED APPLICATIONS

This application claims priority from U.S. Provisional Patent Application Ser. No. 60/794,134, filed Apr. 24, 2006, which is hereby incorporated by reference in its entirety.

DESCRIPTION OF THE INVENTION

1. Field of the Invention

This invention relates generally to lithography and, more particularly, to methods for patterning large areas using immersion lithography.

2. Background of the Invention

Interferometric lithography, the use of an interference pattern between two or more coherent laser beams to expose a photosensitive material, is a well-established technique for the production of small features at the linear-system frequency-space limits of optics. See S. R. J. Brueck, *Optical and Interferometric Lithography—Nanotechnology Enablers*, Proc. IEEE 93, 1704 (2005), which is herein incorporated by reference in its entirety. These extend to a half-pitch of $\lambda/(4n_{low})$ where $\lambda$ is the optical vacuum wavelength and $n_{low}$ is the lower of the refractive index of the photosensitive material or of any planar material above and in contact with the photosensitive material (thin film or bulk dielectric or fluid with surfaces parallel to the photoresist). In the most familiar situation, the photosensitive material is a photoresist (a photosensitive polymer whose solubility in a basic solution is modified by optical irradiation within a specific wavelength range) with a typical refractive index of ~1.7 and the medium in direct contact with the photoresist is air (index=1). In this situation, $n_{low}=\min(1.7, 1)=1$ and the minimum half pitch is $\lambda/4 \sim 48.3$ nm at a wavelength of 193 nm (ArF excimer laser source). Recently, there has been considerable work in extending this limit to smaller scales with the use of immersion fluids. See A. K. Raub, A. Frauenglass, S. R. J. Brueck, W. Conley, R. Dammel, A. Romano, M. Sato and W. Hinsberg, *Deep-UV Immersion Interferometric Lithography*, Proc. SPIE 5377, 306-318 (2004), which is herein incorporated by reference in its entirety. At 193 nm, water is a convenient immersion fluid with a very low loss and a refractive index of 1.44 (at 193 nm) so that using water immersion, the limiting half-pitch becomes 33.5 nm; there is active research into higher index fluids to further extend the range of optical (and interferometric) lithography. A typical result (developed photoresist on an antireflective polymer (ARC) layer on a Si wafer) at a half-pitch of 45 nm is shown in FIG. 1

Two conventional optical configurations that are often used for an interferometric lithography exposure are shown in FIGS. 2A-B. FIG. 2A shows a configuration 100 suitable for a single transverse mode laser, such as an Ar-ion laser or an injection-locked YAG laser that, with additional optics, provides an expanded collimated laser beam 110a, 110b. A Fresnel mirror 120 reflects one half of the laser source 110a onto the other half 110b providing the interference on a wafer 140. Mirror 120 can be positioned along the z-axis by a stage 130. The wafer 140 can be positioned along the x, y, and z axes by a second stage 150. Wafer 140 can be immersed in a medium 160 having a refractive index n. The half-pitch of the pattern is $\lambda/(4n \sin \theta)$ where the angle $\pm\theta$ is the angle of incidence of each beam with respect to the surface normal in the medium having the refractive index n. As shown by FIG. 2A, this arrangement necessarily involves a path length difference at the center of the exposure. This arrangement is suitable for a high coherence laser (such as a single longitudinal and single transverse mode $TEM_{00}$ laser). As a result of the path length difference, the coherence of the laser source sets a limit on the largest area than can be exposed using this configuration. The coherence length is a measure of the random phase fluctuations associated with the laser; within a coherence length, the phase of the electric field is approximately the same for both beams, except for the desired phase slip associated with the periodicity. For larger length differences, there is an increasing random, time-varying component to the relative phases and the contrast of the interference pattern decreases.

Typically, a laser source is described by a complex coherence characteristic. In the simplest description, there are two specifications, a longitudinal coherence describing the phase relationship between two points along the laser beam propagation direction, and a transverse coherence describing the phase relationships between two points across the laser beam. In detailed evaluations, it is necessary to consider the statistics of the coherence between many points, but for the present purposes, this simple two-parameter description is adequate. Typically, for a single transverse mode $TEM_{00}$ laser source, the transverse coherence is quite long and can be ignored in evaluating the interference. This is the reason that the configuration in FIG. 2A can be used for interferometric lithography since clearly wave fronts from opposite sides of the laser beam are interfering at each point on the sample with a suitably large transverse coherence. This results in high contrast interference patterns. The allowable path length difference along the propagation direction is given by the longitudinal coherence (directly related to the temporal coherence). Roughly, the coherence length, $L_{coh}$, the distance over which the phase relationship between the electric fields at two separated longitudinal points decays is given by $\lambda^2/(n\Delta\lambda)$ where $\Delta\lambda$ is the laser linewidth. The path length difference at the vertex of the Fresnel (corner) mirror is small (and vanishes as the gap between the mirror and the sample decreases to zero) but it increases to $2L \sin \theta/n$ at the opposite end of the sample of width L. The maximum sample width is $$\frac{2L_{max}\sin\theta}{n} = \frac{L_{coh}}{n} = \frac{\lambda^2}{n\Delta\lambda}; \quad L_{max} = \frac{L_{coh}}{2\sin\theta} = \frac{\lambda^2}{2\Delta\lambda\sin\theta}.$$

$L_{max}$ is proportional to the vacuum coherence length of the laser and inversely proportional to the sine of the angle $\theta$. But the half-pitch, $p_{1/2}$, is $\lambda/4n \sin \theta$, so $$L_{max} = \frac{2n\lambda}{\Delta\lambda}\frac{\lambda}{4n\sin\theta} = \frac{2nL_{coh}p_{1/2}}{\lambda}.$$

There is an advantage to immersion in that the maximum size of the pattern scales as n, the other parameters are characteristics of the desired pattern ($p_{1/2}$) and the laser source ($L_{coh}/\lambda$) and are not generally controllable once these are defined. In the transverse dimension, parallel to the grating lines, there is no limit to the size based on the laser coherence; the limits are more related to available laser power, cost and perfection of optics, and vibration issues.

Excimer lasers are the dominant lasers used in conventional optical lithography. In contrast to a high transverse coherence source suitable for use in the configuration in FIG. 2A, excimer lasers generally have very poor transverse coherence (many transverse modes are lasing simultaneously with random phases that change for each laser pulse). FIG. 2B shows another configuration 101 that uses an excimer laser to provide a wavefront 111. Configuration 101 can include a beamsplitter 131 and mirrors 133, 134, and 135. Configuration 101 can optionally include a prism 138. A wafer 141 can be positioned along the z-axis by a stage 151. As shown in FIG. 2B, in this configuration the same transverse parts of the wavefront are interfering with each other at the wafer. The allowable deviation between the wavefronts is given by the transverse coherence. The same temporal slippage along the interference path is encountered in this configuration and the formulae derived above apply in this case as well. For a current generation lithography ArF excimer laser (193 nm), the linewidth $\Delta\lambda$ is ~0.1 pm; so $L_{coh}$~36 cm, and for a $p_{1/2}$ of 50 nm and water immersion, $L_{max}$~27 cm. More conventional (and lower cost) line-narrowed excimer lasers typically have $\Delta\lambda$~3 pm, so that $L_{max}$ is reduced to 0.9 cm; finally, free-running excimer lasers (with no line narrowing elements) have $\Delta\lambda$~500 pm, so $L_{max}$~54 µm, and the available area for high contrast interferometric lithography is quite small using this geometry.

Using a grating in place of the Fresnel mirror (shown in FIG. 2A) or the beam splitter (shown in FIG. 2B) eases the longitudinal coherence issue associated with the configurations 100 and 101. While several related configurations are possible, two are illustrated in FIGS. 3A-B. In FIG. 3A, a configuration 300 includes a laser beam 310, a photoresist coated substrate 340, mirrors 320 and 321, and a grating 313. Grating 313 is shown as a phase grating with a $\lambda/2$ path difference between the upper and lower surfaces so that the zero-order transmission is suppressed and only the two first-order diffracted beams are present after the laser beam has passed through the grating 313. (There are also reflected, diffracted beams that are ignored in the figure; these have to be controlled in the experiment to avoid unwanted reflections or scattering onto the photoresist-coated substrate 340. The arrangement shown in FIG. 3A is a Talbot configuration, the grating splits the normal incident beam into two approximately equal intensity diffraction orders, the mirrors, 320 and 321, redirect the diffracted beams so that they are incident onto the photoresist-coated substrate 340. Again, following the solid and dotted lines shows that the interference is between matched parts of the wavefront and so transverse coherence issues are minimized.

FIG. 3B shows a simpler configuration 301 including a grating 311 and a photoresist coated substrate 341, in which the two diffracted orders interfere directly under the grating. Since the path lengths are equal there is no problem with longitudinal coherence, however, the wavefronts are shifted from each other and transverse coherence limits need to be carefully analyzed. Another issue in this configuration is multiple reflection and diffraction between the closely spaced mask and photoresist surfaces. This configuration has been widely used for the production of fiber gratings, where this reflection issue is ameliorated as a result of the narrow, circularly symmetric narrow fiber that eliminates the Fabry-Perot resonances that can be an issue for planar geometries. One approach to reducing these multiple reflection issues that has application to large-area, complex patterning discussed below is to use a cylinder lens 405 to focus a beam to a small line image in the direction perpendicular to the grating lines of grating 410, as shown in FIG. 4. As long as the distance between the grating 410 and a sample 440 is larger than the depth of focus of the line image, these multiple reflection issues are minimized since the beam expands (and the intensity drops) with each bounce.

Both of these geometries can be readily adapted to immersion to provide smaller size lithographic capabilities. In the case of the geometry of FIG. 3A, the propagation phase shift elimination is only perfect if the diffraction angles are the same as the interference angles, which requires that the entire space between the grating and the sample be of the same high index material. Operationally, this can be closely approached with a glass (quartz) block along with a comparatively thin liquid index-matching layer between the block and the wafer. The geometry has to be such that the path length differences are smaller than the source laser coherence length, Similar comments apply to the geometry of FIG. 3B, since the path length between the grating and the substrate can be quite small, this is not too difficult a requirement.

Problems arise, however, because many applications require the patterning of large areas, beyond those accessible with the limited single-area exposure techniques discussed above, with nanometer scale features. Thus, there is a need to overcome these and other problems of the prior art and to provide methods for patterning of large areas with nanometer scale features.

SUMMARY OF THE INVENTION

According to various embodiments, the present teachings include a method for large area patterning using interferometric lithography. The method can include forming a grating pattern to make a first interferometric exposure of a first portion of a photosensitive material disposed over a substrate by interfering two or more laser beams, wherein the two or more laser beams comprise an apodized intensity profile having a continuous intensity variation. The method can further include aligning and overlapping the grating pattern to expose a second portion of the photosensitive material such that the first portion and the second portion form a continuous grating pattern.

According to various embodiments, the present teachings include a method for large area patterning using interferometric lithography. The method can include forming a grating pattern to make a first interferometric exposure of a first portion of a photosensitive material disposed over a substrate by interfering two or more laser beams, wherein the two or more laser beams are apertured with an object with suitably rough edges such that a long-range diffraction from the edges does not impact the periodic pattern except in the vicinity of the edge. The method can further include stepping parallel to the grating pattern that exposed the first portion to expose a second portion of the photosensitive material such that a gap exists between the first portion and the second portion.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, not to be taken in a limited sense.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. $-1$, $-2$, $-3$, $-10$, $-20$, $-30$, etc.

As used herein "step and repeat" or "stepping" refers to moving a beam a distance comparable to the beam size, such as, for example, a Gaussian beam waist. As used herein "scanning" refers to moving a beam a small fraction of the beam waist. Because the laser is pulsed, the motion can be uncorrelated from the laser duration which can be several ns, much faster than any mechanical motion.

There are many applications that require the patterning of large areas, beyond those accessible with the limited single-area exposure techniques discussed above, with nanometer scale features. One such application that requires moderate areas is photonic crystals for LED light extraction. Currently GaN diode manufacturers are using 3" diameter substrates, which sets the scale for the required manufacturing. Over time, the wafer size is likely to grow, just as it has with Si wafers that are now 12" in diameter.

Figure 1:
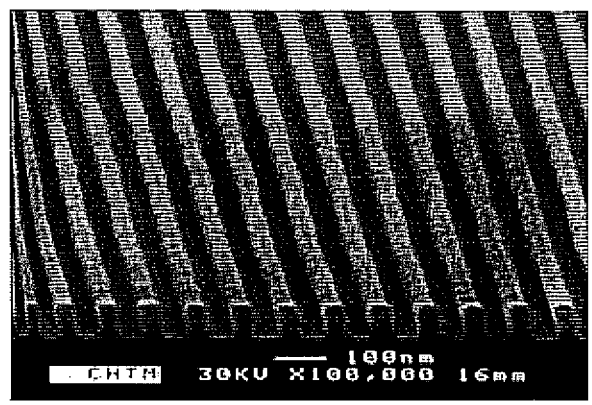
FIG. 1 shows developed photoresist on a antireflective polymer (ARC) layer on a Si wafer at a half-pitch of 45 nm.
Figure 2A:
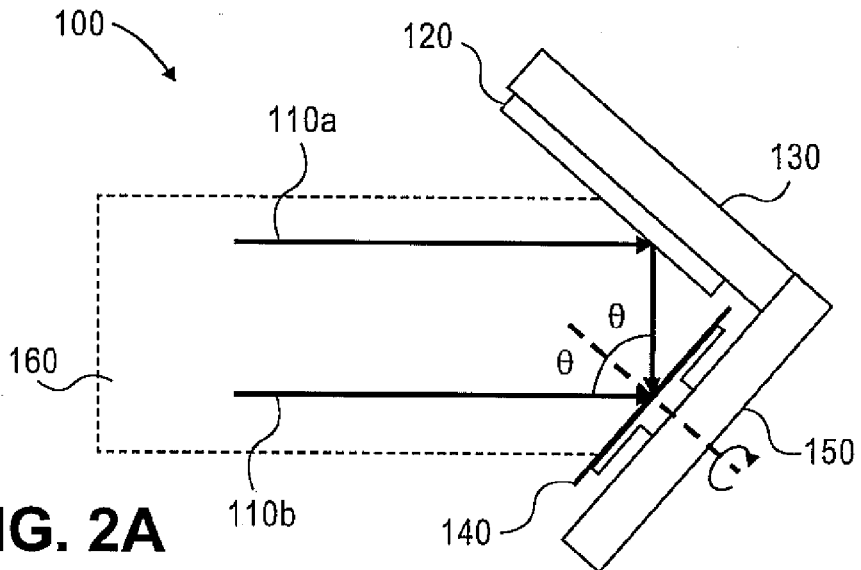
FIGS. 2A and 2B depict conventional optical configurations for interferometric lithography.
Figure 2B:
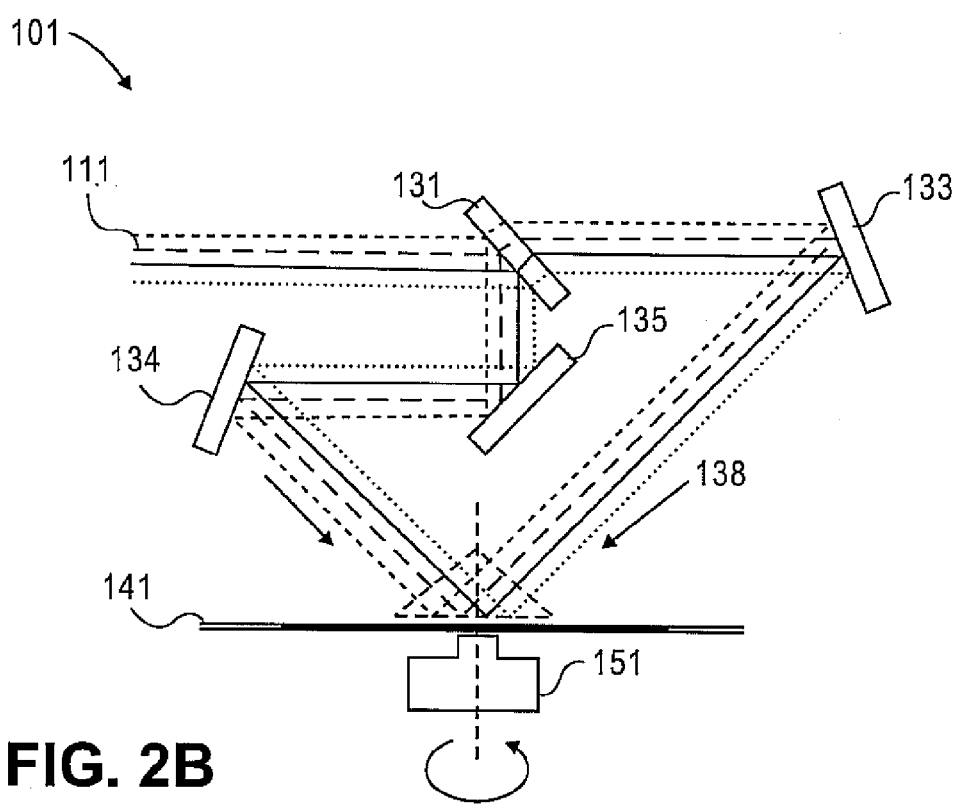
Figure 3A:
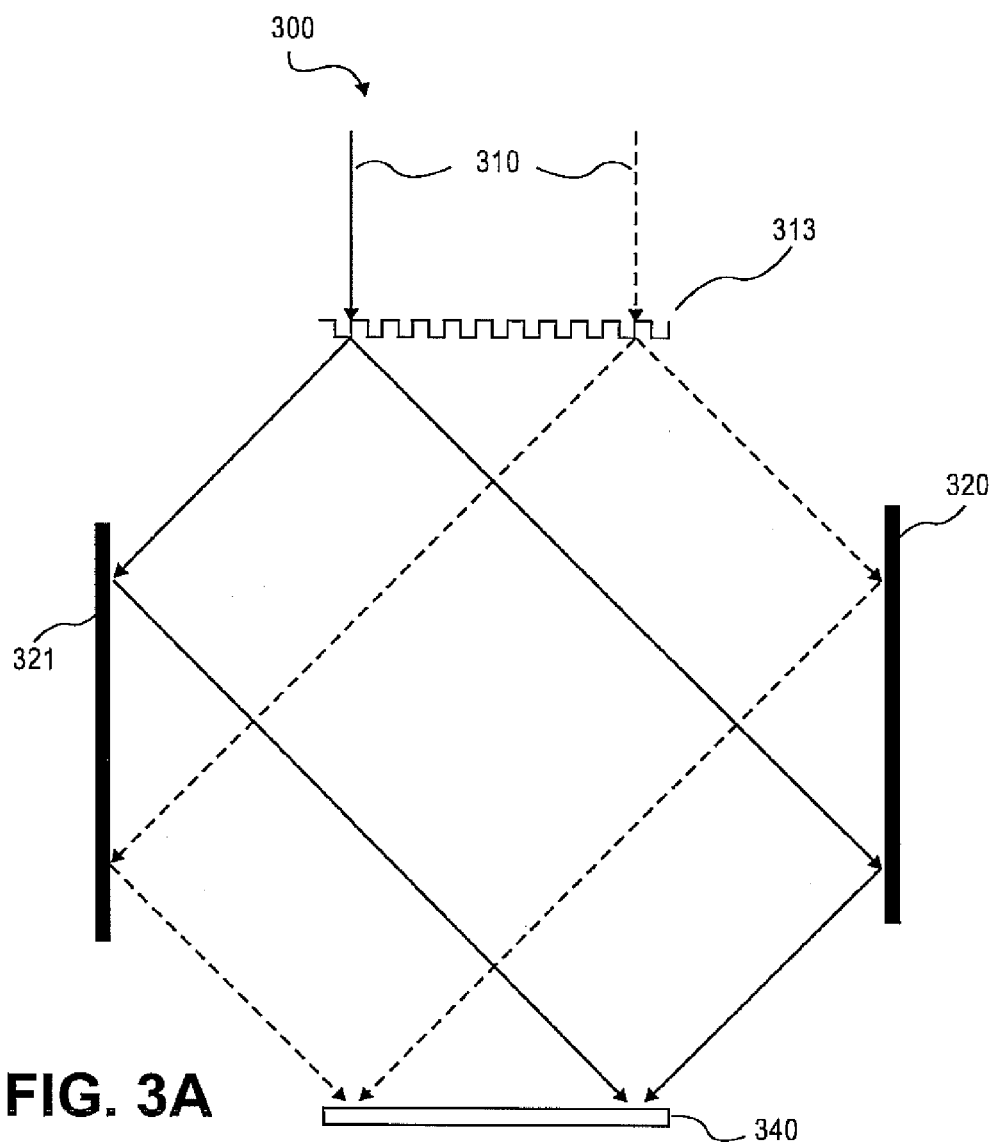
FIGS. 3A and 3B depict additional optical configurations for interferometric lithography.
Figure 3B:
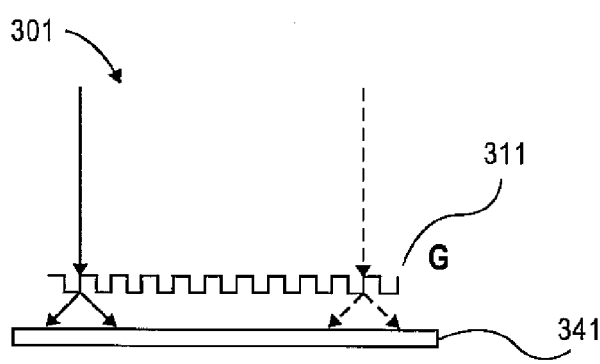
Figure 4:
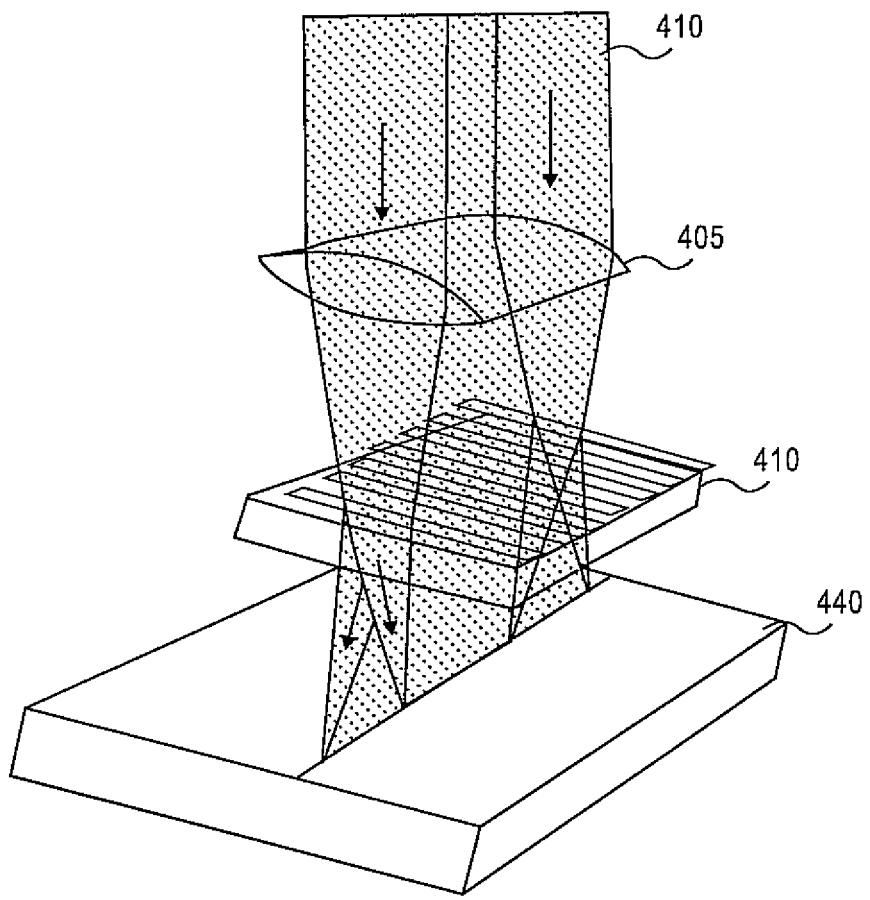
FIG. 4 depicts an optical configuration using a cylinder lens for interferometric lithography.

Perhaps the application requiring the largest area is flat-panel displays. Today's display technology is rapidly extending to quite large size displays, with various technologies offering in-home displays up to 65" diagonal, with even larger displays for commercial applications. While most of the patterned features on these displays are at larger scales, there are some applications requiring very fine patterning. Clearly these dimensions are beyond the scaling possibilities of the configurations of FIG. 2 or 3 and will require some sort of step or scan stitching of smaller areas into one large pattern.

Other applications include optical polarizers (with 1D patterns exhibiting form birefringence, with or without metal structures), nanofluidic channels for biological separations, micro-reactors requiring multiple length scales for a variety of chemical processing requirements, and others. This is not intended to be an exhaustive list, rather it is to suggest the need for developing large-area patterning capabilities that go beyond the capabilities of the simple optical configurations illustrated in FIGS. 2 and 3.

Based on the disclosure above, there are situations for which a step and repeat (or a scanning) approach to large areas is desirable. These can use any of the optical configurations discussed above. Additional issues that should be considered are:

1. Attention needs to be paid to the edges of the pattern. If a sharp edge (on the scale of the wavelength) is placed in the optical path, diffraction from this edge will impact the pattern, causing spatially varying, non-uniform exposures that give rise to variations in the final pattern linewidth. If the substrate is smaller than the image area, or equivalently if the hard edge is defined in the plane of the substrate, this problem does not arise.

2. The exposure areas must be aligned to each other so that the grating pattern is continuous across the total exposure area. This will likely require an active alignment step since mechanical motion is not sufficiently precise for nm-scale alignments over large areas.

Issue 1 can be addressed by using an apodized intensity profile with a continuous intensity variation, for example a Gaussian beam. By matching the intensity profiles in multiple exposures to ensure that the total exposure fluence is constant across the entire substrate, a uniform exposure eliminating diffractive effects in the regions of multiple exposure can be achieved.

Figure 5:
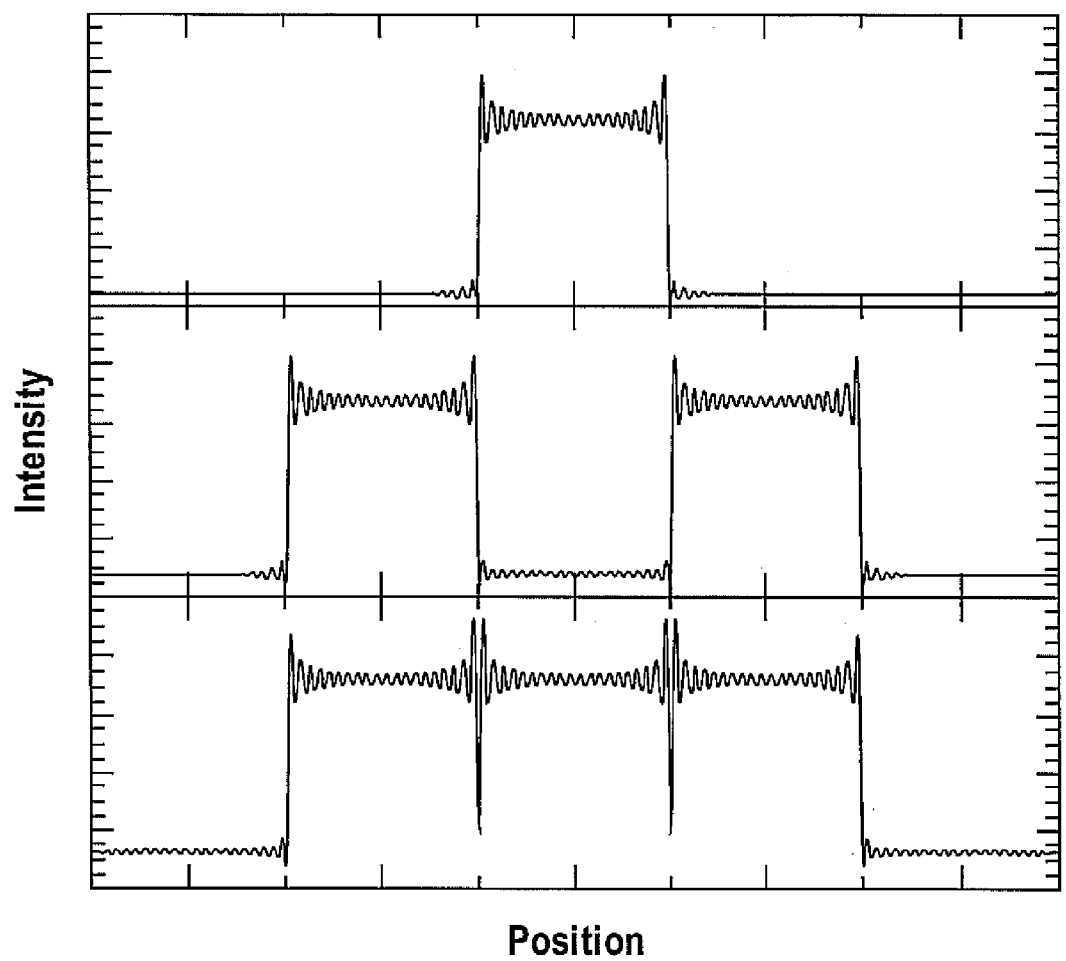
FIG. 5 is a graph showing intensity versus position resulting from stitching together, by step and repeat methods, three exposures.

A simple calculation serves to illustrate both the problem and the solution. FIG. 5 shows the results of stitching (step and repeat) together three exposures with a hard mask (e.g. subject to diffraction as the beams propagate from the masks to the substrate). The top trace shows the result of a single interferometric exposure (only the overall intensity profile is shown, the fringes resulting from the interference are not presented). The details of the optical system determine the periodicity and decay of the intensity ripples; the result shown is illustrative only. The middle trace shows the result of two exposures, one to either side of the original exposure. Finally, the bottom trace shows the result of adding all three exposures. The problems are quite clear: 1) The intensity ripples caused by the diffraction are quite dramatic and would give rise to linewidth variations in the nanoscale interferometric patterning. 2) The alignment between the individual exposures is quite critical, a slight shift in the position leaves a band of either unexposed or double exposed photoresist. In either case, the pattern uniformity suffers. Note that in any case the high spatial frequency interferometric patterns need to be aligned; a procedure for accomplishing this alignment will be discussed below.

Figure 6:
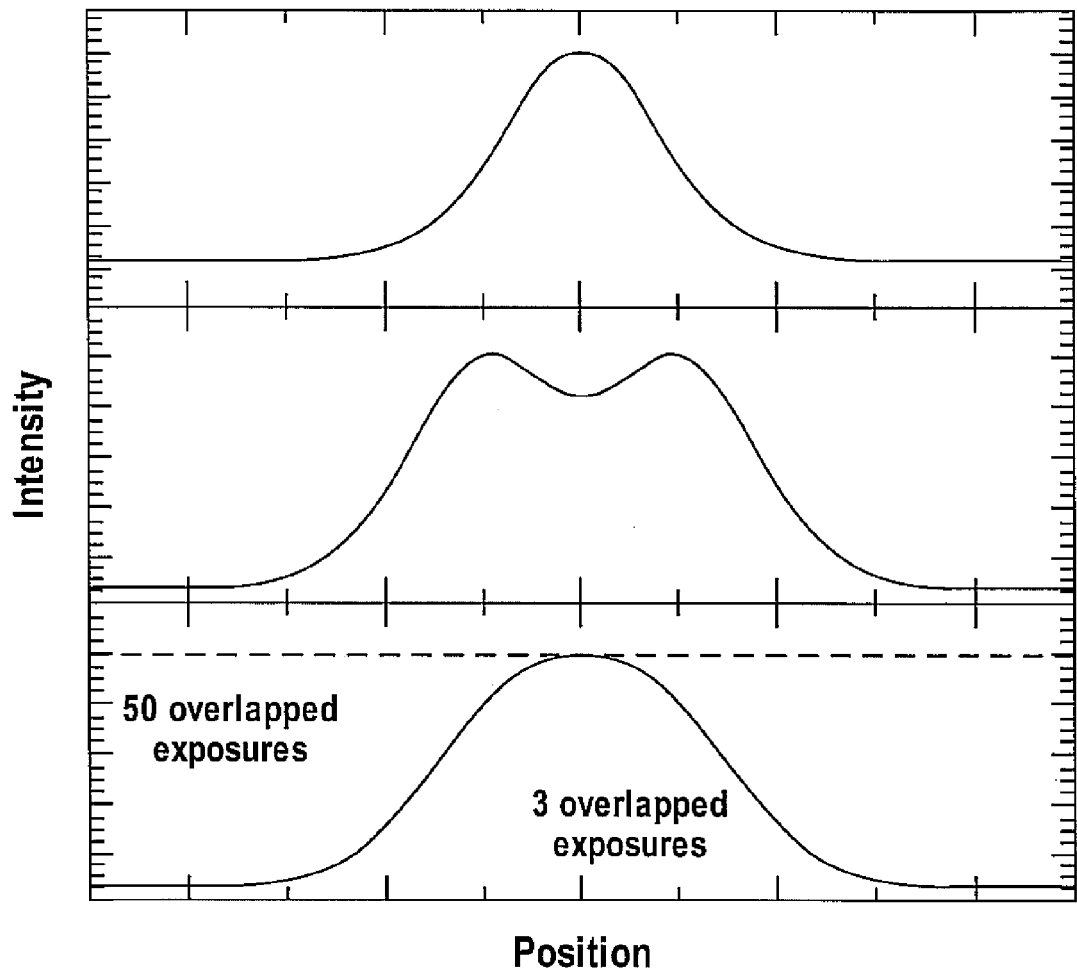
FIG. 6 is a graph showing intensity versus position when an apodized beam is overlapped between exposed areas to achieve a uniform exposure area.

An alternative approach is to use an apodized beam where overlap between exposed areas is necessary to achieve a uniform exposure area. A simple example of a Gaussian beam profile is shown in FIG. 6. For a single exposure (top panel), the Gaussian beam profile is evident; again, the high frequency pattern associated with the interference is not shown.

For two overlapped exposures with a shift comparable to the ½ width of the Gaussian, a more uniform exposure over a somewhat larger area is achieved (middle panel), but there remains a variation in the intensity across the pattern. Three overlapped exposures (bottom panel) provide a wider exposure area than the single exposure. Finally, a series of exposures with comparable shifts of approximately the Gaussian half-width can provide a quite uniform exposure over the entire area of the figure (dotted line). Because many exposures contribute to the total dose, the pattern is tolerant of alignment (of the Gaussian) errors, but again the high spatial frequency patterns must be aligned with each other to avoid averaging out the interference fringes. There are many patterns that would be similarly effective, a Gaussian is not the only possibility. The requirement is that the intensity change slowly (on the scale of the wavelength) at the edge of the pattern; for example adding a large flat intensity region in the center of the Gaussian would allow for a uniform exposure over a larger area with fewer repeat exposures, but would increase the required precision for overlapping the exposures.

There are potential applications that would be tolerant of a small gap between exposure areas. A relatively simple strategy of a nonuniform (roughly on the scale of the wavelength) apodization of the beam would suffice in this case. The idea is that the local variations would scatter enough light to eliminate the interference pattern just at the edges of the pattern, while not having the long range impact of diffraction from a sharp, knife edge.

There are several strategies for overlapping the patterns, the choice of a particular strategy depends to some extent on the particular patterns desired, both the pitch and the overall pattern area. Depending on the desired size, the choices are to step parallel to the grating lines, perpendicular to the grating lines, or some combination of both—likely a rectilinear approach, first parallel then perpendicular or vise versa. Another important parameter is the size of each exposure area. This is related to throughput. Once a laser is chosen, its output power levels are determined. Ideally, the optical system should use all of the available laser power to expose as large an area as possible in order to have the highest throughput. A related issue is the duration of each exposure. An ArF laser has significant spatial variations that vary from pulse-to-pulse as a result of the multiple transverse modes that randomly (different for each pulse) interfere constructively and destructively. A uniform exposure dose can be obtained by averaging over multiple laser pulses, typically 10 to 100; thus the dose for each pulse must be a fraction of the total required dose. Excimer lasers are typically relatively high peak power, implying that relatively large areas, limited by the coherence factors discussed above, will be advantageous from throughput considerations.

Figure 7:
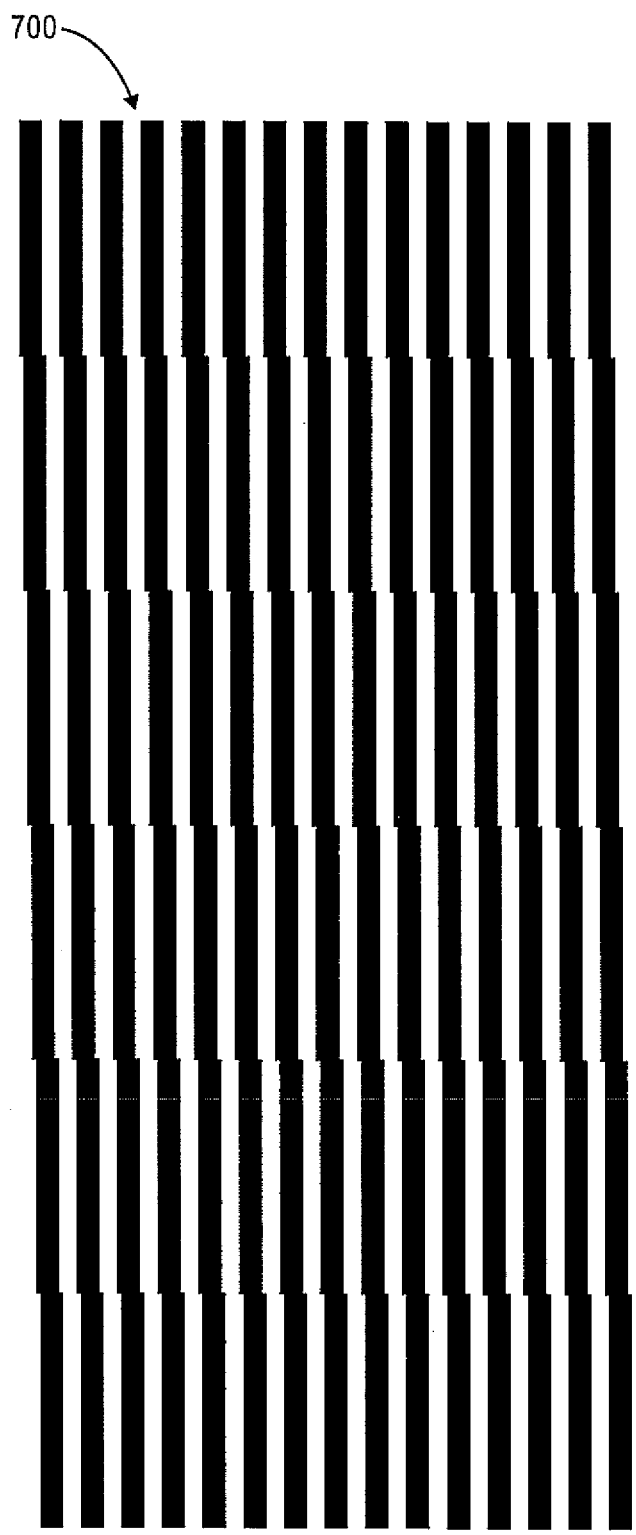
FIG. 7 shows an example of a pattern that is obtained if there is a small offset between exposures.

There are also multiple approaches to the alignment between exposures. The Si IC industry has developed very high precision stages using interferometer control to step and scan between exposure areas without referencing back to the optical system; these stages have adequate travel for Si wafers (currently 300 mm diameter). For the very small pitch patterns that are of interest for interferometric lithography, the accuracy of these stages over large throws is possibly an issue. Another issue is the alignment of the optical system to the stage, specifically the precision to which the grating lines are aligned to the stage translational axes. In principle, this can be mapped out and corrected with the feedback, but only to the extent that it is stable with respect to temperature variations, variations in the transmission medium (gas and/or liquid), stage loading, etc. This particular issue provides a benefit for smaller areas in the direction parallel to the grating. The requirement is that the translation perpendicular to the grating lines be held to a small fraction (take 10% for illustrative purposes; the actual specification will depend on the application) of the period. The allowable runout depends on the extent of the patterned area in the direction parallel to the grating lines. Runout is the total shift in the grating lines from the desired pattern along/across the entire patterned area. There is also often a specification on the total runout across the full patterned area, again this will be application specific. This runout can be composed of both systematic (such as a misalignment of the pattern with respect to the stage axes, periodic variations such as screw error, and temperature drifts during the exposure) and random (stochastic variations in the position) components. With additional stage monitoring, some of the systematic errors can be compensated. FIG. 7 shows an example of a pattern 700 that is obtained if there is a small offset, less than the linewidth, between exposures. For clarity, these exposures are assumed to be precisely stacked in the vertical direction, and offset slightly in the horizontal direction. In a realistic exposure situation with the apodized exposures discussed above, these exposures would be overlapped and the result would be a slight broadening of the line (and shrinkage of the space) as well as the overall drift of the line to one side; the sharp steps at the end of each exposure would not be generated.

Figure 8:
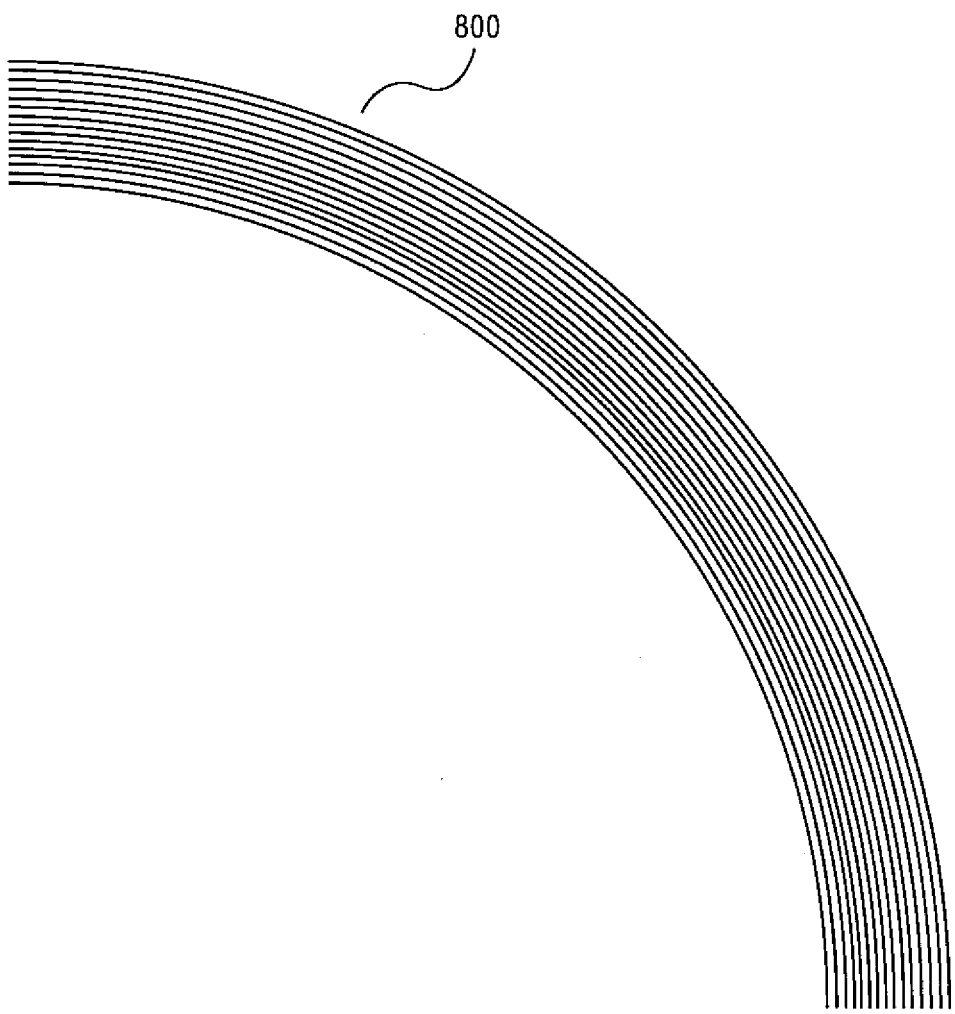
FIG. 8 shows ¼ of a circular track formed with sections of straight track rotated slightly.

This scheme also lends itself to the production of more complex patterns with additional utility. For example, many memory devices are built around circular tracks. Hard disks at present use a continuous magnetic film along with a read-write head that moves in a circular pattern above the magnetic material. The industry road map calls for segmenting the magnetic material into densely packed circular tracks (similar to the tracks in a DVD) in order to increase the storage density. Today's disks are 2.5 inch diameter with a 0.5 inch hub region. The issue for interferometric lithography is the production of patterns with an overall circular symmetry. The approach outlined above, where a small section of the pattern is written and then shifted slightly with a precision stage mechanism and printed again provides an approach to realizing this pattern. FIG. 8 shows ¼ of a circular track 800 formed with sections of straight track rotated slightly (3° in the example, and a real exposure the rotation would be much smaller and smaller sections would be exposed in each linear track).

A second approach to the large area grating patterns is to employ an active feedback loop referenced to the optical system. Again, multiple approaches are possible, the feedback loop can be based on the actinic wavelength (e.g. the 193 nm source) or on a separate, longer wavelength source. The system can use the main optics or an auxiliary optical system, and the reference can be either to a prefabricated grating that is positioned on the stage, or to the latent image of the grating in the previously exposed photoresist on the substrate being exposed. The choice among these various options, depends to some extent on the overall size of the pattern, and therefore how much motion has to be accomplished between the alignment and exposure steps (if for example an artifact is placed to the side of the substrate). The techniques in the UNM patents on alignment and overlay of submicrometer structures will be useful in these schemes.

Other embodiments of the invention will be apparent to those skilled in the art from consideration of the specification and practice of the invention disclosed herein. It is intended that the specification and examples be considered as exemplary only.

What is claimed is:

1. A method for forming a grating pattern by large area patterning using interferometric lithography, the method comprising:

directing two or more laser beams from a free-running, multimode, pulsed excimer laser without line narrowing through a phase grating with a $\lambda/2$ path difference between an upper surface and a lower surface toward a pair of mirrors, wherein the phase grating is operable to suppress zero-order transmission from the laser beams and allow only first-order diffraction beams to propagate through the phase grating onto the pair of mirrors, wherein long-range diffraction from edges of the phase grating does not impact the grating pattern except in a vicinity of an edge of the grating pattern;

exposing a first portion of a photosensitive material disposed over a substrate by interfering the two or more laser beams to form the grating pattern; and aligning and overlapping the grating pattern to expose a second portion of the photosensitive material using the laser such that the first portion and the second portion form a grating pattern with a gap corresponding to a step between the exposure areas such that intensity profiles in the first exposure and the second exposure match so that a total exposure fluence is constant across the substrate.

2. The method of claim 1, wherein aligning and overlapping the grating pattern to expose a second portion of the photosensitive material comprises stepping parallel to the grating lines or perpendicular to the grating lines.

3. The method of claim 1, wherein aligning and overlapping the grating pattern to expose a second portion of the photosensitive material comprises scanning parallel to the grating lines or perpendicular to the grating lines.

4. The method of claim 1, further comprising exposing a plurality of additional portions by scanning or stepping to form a continuous grating pattern.

5. The method of claim 1, wherein aligning and overlapping the grating pattern to expose a second portion of the photosensitive material comprises a combination of stepping parallel and perpendicular to the grating lines.

6. The method of claim 1, wherein aligning and overlapping the grating pattern to expose a second portion of the photosensitive material further comprises compensating for systematic alignment errors.

7. The method of claim 1, wherein aligning and overlapping the grating pattern to expose a second portion of the photosensitive material further comprises using an active feedback loop.

8. The method of claim 7, wherein using an active feedback loop comprises using optical feedback from one of or a combination of diffraction from an artifact place to a side of the desired pattern and a latent image formed in the exposure of the first portion of the photosensitive material.

* * * * *